(12) United States Patent
Kohama

(10) Patent No.: US 6,563,366 B1
(45) Date of Patent: *May 13, 2003

(54) HIGH-FREQUENCY CIRCUIT

(75) Inventor: Kazumasa Kohama, Kanagawa (JP)

(73) Assignee: Sony Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,855

(22) Filed: Oct. 28, 1998

(30) Foreign Application Priority Data

Oct. 30, 1997 (JP) ............................................... 9-298493

(51) Int. Cl.[7] ......................... H01L 29/80; H03K 17/16
(52) U.S. Cl. ........................ 327/382; 327/389; 327/427; 327/566; 257/275
(58) Field of Search ................................ 327/427, 442, 327/567, 564, 566, 379, 382; 257/229, 275

(56) References Cited

U.S. PATENT DOCUMENTS

| 3,824,337 | A | * | 7/1974 | Sangster et al. ............. 257/226 |
| 4,298,879 | A | * | 11/1981 | Hirano ........................ 357/22 |
| 4,514,646 | A | * | 4/1985 | Ando et al. ............. 307/200 B |
| 4,985,642 | A | | 1/1991 | Gamand ..................... 307/304 |
| 5,563,545 | A | | 10/1996 | Scheinberg ................. 327/427 |
| 5,777,669 | A | * | 7/1998 | Uwatoko et al. ........... 348/308 |
| 5,818,283 | A | | 10/1998 | Tonami et al. ............. 327/427 |
| 6,175,394 | B1 | * | 1/2001 | Wu et al. .................... 257/360 |

FOREIGN PATENT DOCUMENTS

| EP | 732 808 | 9/1996 |
| JP | 08 307232 | 11/1996 |
| JP | 9-8621 | 1/1997 |
| JP | 10 084267 | 1/1998 |

* cited by examiner

Primary Examiner—Dinh T. Le
(74) Attorney, Agent, or Firm—Rader, Fishman & Grauer PLLC; Ronald P. Kananen, Esq.

(57) ABSTRACT

A high-frequency circuit, wherein there is provided a switching transistor connected between an input terminal and an output terminal, with a gate electrode connected to a control terminal via a resistance element, and with an effective gate portion of the gate electrode divided into a plurality of sections, and arrangement is made of additional capacitance elements added in parallel to a capacitance between a gate and a source or drain of the switching transistor at positions in proximity to one ends of at least two effective gate sections of the plurality of effective gate sections. Preferably, there is provided a short-circuiting transistor similarly having an additional capacitance element between the output terminal Tout and a reference voltage supply line.

17 Claims, 13 Drawing Sheets

UNIT FET WITH AN ADDITIONAL CAPACITANCE

FIG.1
PRIOR ART
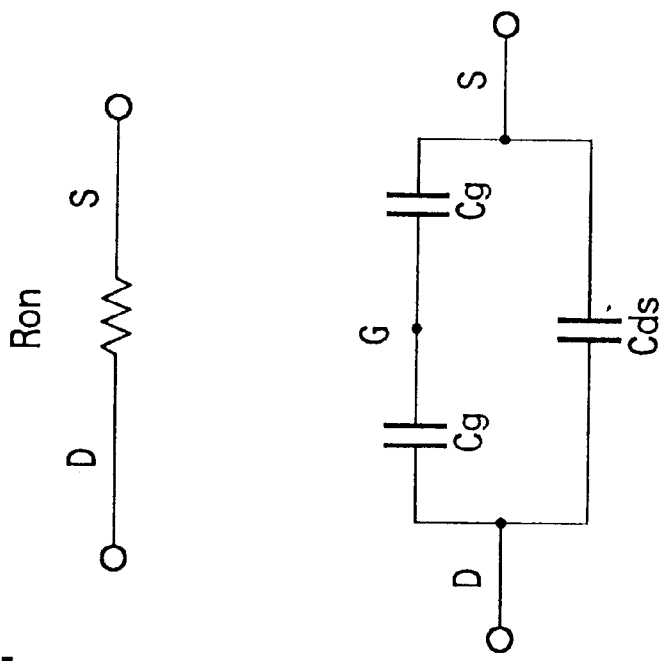
ON-STAGE
OFF-STAGE
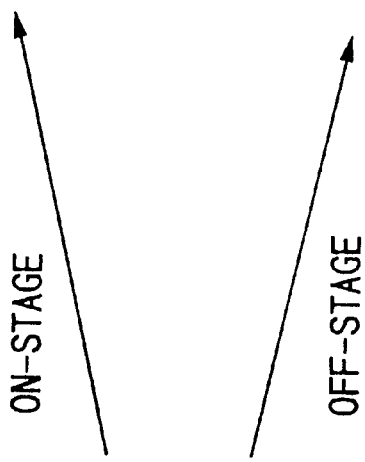
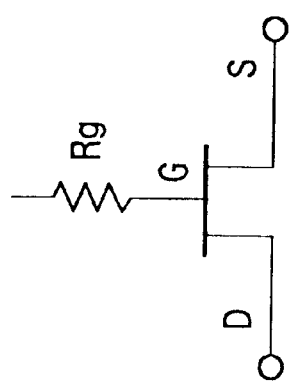

FET1-2(FET2-2)
UNIT FET WITH AN ADDITIONAL CAPACITANCE

A-A CROSS-SECTION

UNIT FET WITHOUT AN ADDITIONAL CAPACITANCE

HIGH-FREQUENCY CIRCUIT

BACKGROUND OF THE INVENTION

1. Field of the Invention

The present invention relates to a high-frequency circuit having a high-frequency switch capable of being driven by a low voltage which is built into in a portable device such as a cellular phone.

2. Description of the Related Art

Dazzling developments have been made in mobile communications such as cellular telephones and personal communications in recent years. In Japan, for example, in addition to the conventional 800 MHz band analog cellular phones, 800 MHz and 1.5 GHz band digital cellular phones (PDC) have been newly commercialized and, several years ago, the "Personal Handiphone System" (PHS) started service. Recently, in particular, there have further been active developmental efforts on a global scale of the next generation digital communications using the latest digital modulation technologies. The field of mobile communications is becoming increasingly active.

Such mobile communications, especially digital communications systems, often make use of the quasi-microwave band. Therefore, there have been strong demands for a switching circuit (high-frequency switching circuit) for switching high-frequency signals used in the portable terminals of these systems which is provided with not only superior high-frequency characteristics, but also the ability to be driven with a low voltage.

Since portable terminals handle signals of as high as the GHz band, switching circuits using GaAs FETs exhibiting excellent high-frequency characteristics are starting to be used for switching high-frequency signals in portable terminals.

FIG. 1 shows a switching FET constituting a basic unit of a high-frequency switching circuit. The switching FET shown in FIG. 1 is connected at its gate to a resistance element Rg having a high resistance value. As a result, the equivalent circuit of the switching FET can be represented as an on-resistance Ron of several ohms in an on-state and of a cut-off capacitance of several hundreds of fF in an off-state. The cut-off capacitance in an off-state is the combined capacitance of the series capacitance between a gate and a source or drain (both referred to as Cg in this example) and a capacitance Cds between the source and drain connected in parallel. Since the FET with a gate connected to the high resistance element Rg clearly exhibits a resistance characteristic and a capacitance characteristic in the on-state and the off-state in this way, it has excellent characteristics as a basic unit of a quasi-microwave band switching circuit.

FIG. 2 is a diagram of impedance changes in a gate bias state of a switching FET.

An impedance Zds between a drain and a source of the switching FET becomes sufficiently large when the gate bias voltage Vg is less than a pinch-off voltage Vp, while conversely becomes sufficiently low when the gate bias voltage Vg is close to the gate voltage Vf at which the FET turns on (referred to as a "turn-on voltage" hereinafter). Accordingly, when using this FET for switching, the gate bias voltage Vg(on) when the FET is turned on is set to be larger than the turn-on voltage Vf, while the gate bias voltage Vg(off) when the FET is turned off is set to be sufficiently lower than the pinch-off voltage Vp.

When such a switching FET handles a large power (large amplitude) RF signal, distortion and other disadvantages with signal deterioration occur. This distortion disadvantage at the time of large power input is related to the fact that it is impossible to obtain a large voltage difference between the gate bias voltage Vg(on) and Vg(off) when having to make the drive voltage as small as possible such as in a portable terminal. Namely, to ensure that Vg(on) does not fall below the turn-on voltage Vf despite the trend toward a small voltage difference between the gate bias voltages Vg(on) and Vg(off) due to the low voltage driving function, it is necessary to narrow the margin between the voltage Vg(off) and the pinch-off voltage Vp and, as a result, signal distortion easily arises in the off-state.

As shown in FIG. 2, when an RF signal is applied to the FET in the off-state, the gate bias voltage is subjected to modulation by the RF signal around Vg(off). When the RF signal has a large amplitude, the degree of modulation becomes large. When it exceeds a certain limit, the modulated gate bias voltage Vg becomes larger than the pinch-off voltage Vp as shown in FIG. 2. Finally, the FET is no longer in the pinch-off state, that is, an off-state, and as a result the waveform of the output voltage becomes distorted.

In order to reduce the signal distortion at the time of a large power input, a high-frequency switching circuit having a multi-stage configuration with a plurality of FETs connected in series is ordinarily used.

FIG. 3 shows an example of an FET switching circuit of a three-stage configuration.

This FET switching circuit 100 comprises a switching FET portion 101 and a short-circuiting FET portion 102 which is connected between the output of the switching FET portion 101 and a supply line (Vss line 103) of a common voltage and holds an output node of the switching FET portion 101 in the off-state at the common voltage. Each of the portions has a multi-stage configuration.

In the switching FET portion 101, the three FET 1-1 to FET 1-3 are connected in series between an input terminal Tin and an output terminal Tout of the high frequency signal, and gates of the FETs are connected to a common control signal input terminal Tc1 via high resistance elements Rg. Similarly, in the short-circuiting FET portion 102, the three FET 2-1 to FET 2-3 are connected in series between the output terminal Tout of the high frequency signal and the Vss line 103, and gates of the FETs are connected to a common control signal input terminal Tc2 via high resistance elements Rg.

In the high-frequency switching circuit 100 having the above configuration, in an on-state, all of the switching FET 1-1 to FET 1-3 are on and all of the short-circuiting FET 2-1 to FET 2-3 are off. When the high frequency switching circuit 100 shifts to an off-state, all of the switching FET 1-1 to FET 1-3 turn off and all of the short-circuiting FET 2-1 to FET 2-3 shift to an on-state. Even if there is a slight leakage of signal components in the switching FET 1-1 to FET 1-3 in an off-state, this is relieved to the common potential and therefore high reliable insulator at a high-frequency between the input and output can be achieved. That is, by being combined with the short-circuiting FET 2-1 to FET 2-3, the switching FET 1-1 to FET 1-3 can obtain excellent isolation characteristics when turned off without any accompanying signal loss at the time of an on-state.

By making each of the FET portions a multi-stage configuration, the RF signal voltage input is divided in accordance with the number of stages. While each of the stages of the FETs is subjected to RF modulation, though to a different degree, distortion is more difficult than in the case of a single-stage configuration since the input signal voltage is divided. Accordingly, a switching circuit with an FET portion having a multi-stage configuration features a higher maximum power handled and improved distortion tolerance at the time of large power input.

Next, the maximum power handled by this multi-stage configuration high-frequency switching circuit will be explained in more detail with reference to the equivalent circuit in the off-state.

FIG. 4 is a view of an equivalent circuit of the high-frequency switching circuit 100 shown in FIG. 3 in the on-state, that is, the state with the switching FET portion 101 in the on-state and the cut-off FET portion 102 in the off-state. Note that when the switching circuit 100 is in the off-state, for which the equivalent circuit is not shown, the state (on/off) of the switching FET portion 101 and the short-circuiting FET portion 102 becomes reverse to the case in FIG. 4. In both cases, the distortion of the output signal when one of the FET portions of the multi-stage configuration is in an off-state becomes a disadvantage. Therefore, the explanation will be made for an example of the short-circuiting FET portion 102 being in an off-state as shown in FIG. 4 here.

As mentioned above, the FET portion in the off-state (the short-circuiting FET portion 102 in FIG. 4) determines the maximum power handled when driving with a low voltage. Assume that an RF signal having a voltage amplitude of VRF is applied to the input terminal Tin, the decrease at the switching FET portion 101 can be ignored, and the sizes of the FET 2-1 to FET 2-3 in the short-circuiting FET portion 102 are the same. When the RF signal is applied to the short-circuiting FET portion 102, a voltage vrfn (n=1, 2, . . . , 6) whose average value is VRF/6 is respectively applied between the gate and the drain or source of the FET 2-1 to FET 2-3. This voltage vrfn has a voltage amplitude that give RF modulation to each gate, so if any of FET 2-1 to FET 2-3 leaves the pinch-off state by the application of this voltage, that is, vrfm>Vp−Vg(off), current leaks from the short-circuiting FET no longer in the pinch-off state to the common line Vss at that instant and generates a power loss. As a result, the RF signal that appears at the output terminal Tout becomes distorted at the peak side of the amplitude.

Generally, the maximum power handled Pmax of a switching circuit comprised of n-stages of FETs connected in series can be expressed by the following formula when assuming a load impedance as Z0.

$$P\text{max} = 2\{n(Vp-Vg(\text{off}))\}^2/Z0 \tag{1}$$

To increase the maximum power handled Pmax, it can be considered to increase n in formula 1, to set Vp high, or to set Vg(off) low. However, when the circuit is used in a portable terminal which has to be able to be driven with a low voltage, Vg(off) cannot be set very low as explained above. If Vp is set high, the on-resistance Ron of the FETs increases and leads to an increase of loss at the time of switching on (ground loss of leakage signal components in short-circuiting FETs), which is not preferable. Furthermore, in the case of increasing the number of stages n, it is necessary that each FET have a gate width of n times that of a one-stage configuration FET in order to realize the identical on-resistance Ron of a single-stage configuration. The increase of the area is inevitable just by increasing the number of stages n of the FETs, but moreover the gate width of each FET has to be multiplied by n. Therefore, the area occupied by the switching circuit becomes larger and leads to higher cost due to the increase of the chip area.

In this way, there is a tradeoff between the rise of the maximum power handled in a high-frequency switching circuit accompanying driving at a low voltage and the deterioration of switching characteristics or the increase of costs.

SUMMARY OF THE INVENTION

An object of the present invention is to provide a high-frequency circuit which uses FETs with effective gate portions divided into a plurality of sections, such as with a so-called inter-digital gate configuration, for a large power switch operatable at a low voltage, which is stable in operation of its FETs, and which is excellent in its ability to eliminate signal distortion.

To solve the above disadvantages of the prior art and to realize the above object, the high-frequency circuit of the present invention is a high-frequency circuit having a switching transistor with one of a source electrode and a drain electrode connected to an input terminal side of a high frequency signal and with the other of the source electrode and the drain electrode to an output terminal side of a high frequency signal and with a gate electrode connected through a resistance element to a control terminal, an effective gate portion of the gate electrode being divided into a plurality of sections, characterized by having an additional capacitance element which is arranged at a location in proximity to one ends of at least two effective gate sections among the plurality of the effective gate sections and which is connected in parallel to a capacitance element between a gate and a source or drain of the switching transistor.

Preferably, it further has between the output terminal and a voltage supply line of a reference voltage a short-circuiting transistor which is held in a non-conductive state when the switching transistor is in a conductive state and which shifts to a conductive state when the switching transistor becomes non-conductive.

The short-circuiting transistor may be provided with an additional capacitance element in the same way as the switching transistor.

At least one of the switching transistor and short-circuiting transistor may be provided with additional capacitance elements at all of a plurality of unit transistors formed by division of the effective gate portion. Alternatively, additional capacitance elements may be provided at suitable locations of any of the unit transistors where a large effect of improvement of the characteristics can be expected (for example, between the gate and source or drain of the unit transistors positioned at the two ends of the series connection).

The additional capacitance element may be comprised by a so-called MIM capacitor (metal-insulator-metal capacitor). Specifically, the additional capacitance element may use a connection portion of the gate electrode connecting at least two effective gate sections as one of the capacitor electrodes and use an electrode portion of the source or drain overlapping the connection portion through an inter-layer insulating film as another capacitor electrode.

In the high-frequency circuit having the above configuration, a cut-off transistor is off when the built-in switching transistor is in the on-state. When the switching circuit is in an on-state, its output side is grounded via a sufficiently large capacitance and is open in terms of high frequency, so an input high-frequency signal can be output almost without loss.

On the other hand, when the switching transistor is turned from on to off and the cut-off transistor is turned off from on, this switching circuit is turned off, the input side and the output side are insulated by high-frequency due to a sufficiently large cut-off capacitance, and the output side is grounded via a small resistance. Accordingly, even if a signal leaks from the switching transistor, this can be relieved to the ground potential, so that a high insulation characteristic can be obtained between the input and the output.

Especially in the high-frequency circuit of the present invention, because additional capacitance elements are arranged near the connecting portion of the effective gate sections obtained by division in at least one of the switching or cut-off transistors, the impedance as seen from each of the units transistors, that is, the additional capacitance, and the inductance etc. of a connection line are balanced and the parasitic component itself is small. As a result, the operation of the switching or cut-off transistor becomes stable.

The balanced arrangement of additional capacitance elements raises the limit of the applied voltage which does not cause signal distortion of the unit transistors. Therefore, even if a signal having a larger enough amplitude to cause distortion is applied, it is possible to output a high-frequency signal having a large amplitude without causing any distortion of waveforms until reaching one of the limits of applied voltage of the unit transistors with additional capacitor elements whose limits were raised or the limits of other unit transistors without additional capacitance elements. Namely, the power distortion tolerance in the switching circuit as a whole is improved. Also, the improvement of the power distortion tolerance means greater leeway for driving by a low voltage while maintaining the strength (large power) of a high-frequency signal handled.

BRIEF DESCRIPTION OF THE DRAWINGS

These and other objects and features of the present invention will become clearer from the following description of the preferred embodiments given with reference to the accompanying drawings, in which:

FIG. 1 is a view of the configuration of a switching FET forming a basic unit of the high-frequency switching circuit and an equivalent circuit of its operation;

DESCRIPTION OF THE PREFERRED EMBODIMENTS

Below, preferred embodiments will be described with reference to the accompanying drawings.

The high-frequency circuit of the present invention has a high-frequency switching circuit of an FET configuration. The type of the FETs which comprise this high-frequency switching circuit is not limited, however, for example, a junction type or a Schottky gate type FET formed on a GaAs substrate is especially preferable since it has an excellent high-frequency characteristic.

Below, the high frequency switching circuit built into the circuit according to the present invention will be explained in detail with reference to the figures taking as an example a case configured by junction gate type GaAs FETs.

In order to achieve an increase of the maximum power handled without sacrificing other factors such as the switching characteristics, an additional capacitance element is sometimes connected to the FET for the purpose of the improvement of the distortion tolerance.

Figure 5:
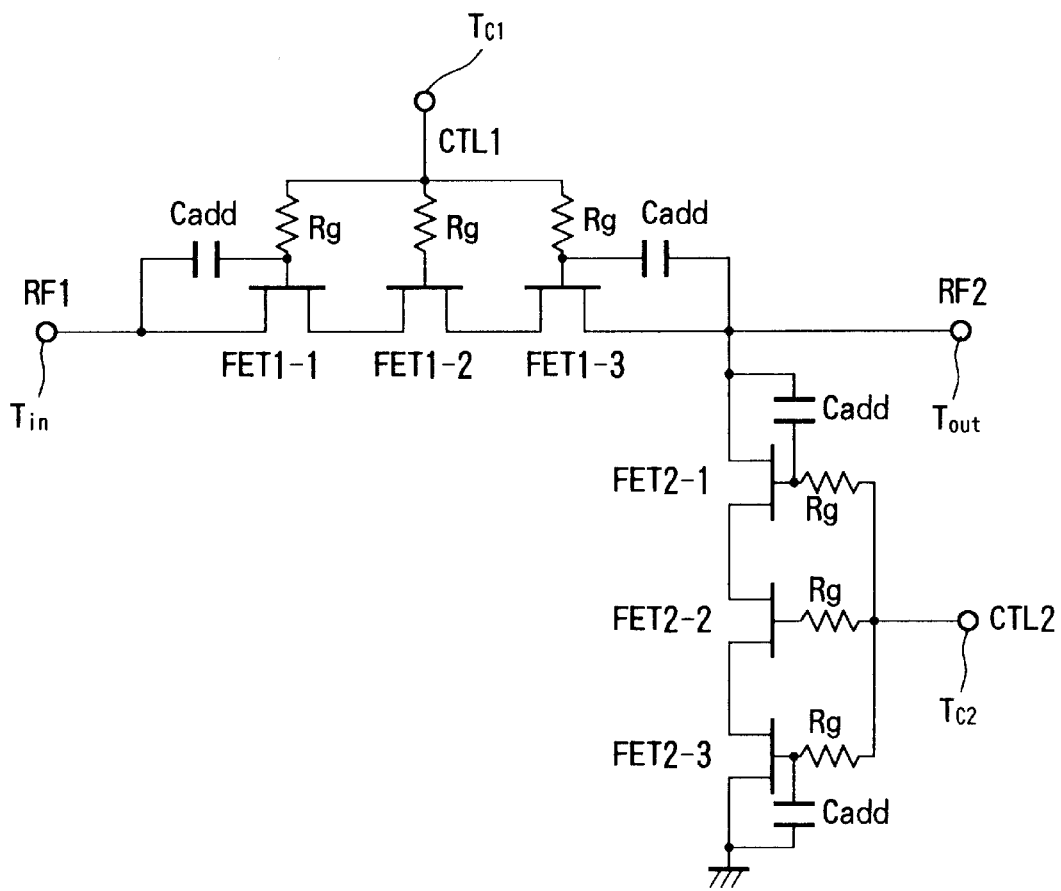
FIG. 5 is a view of an example of a switching circuit wherein the power distortion tolerance is improved by providing an additional capacitance element.
Figure 6:
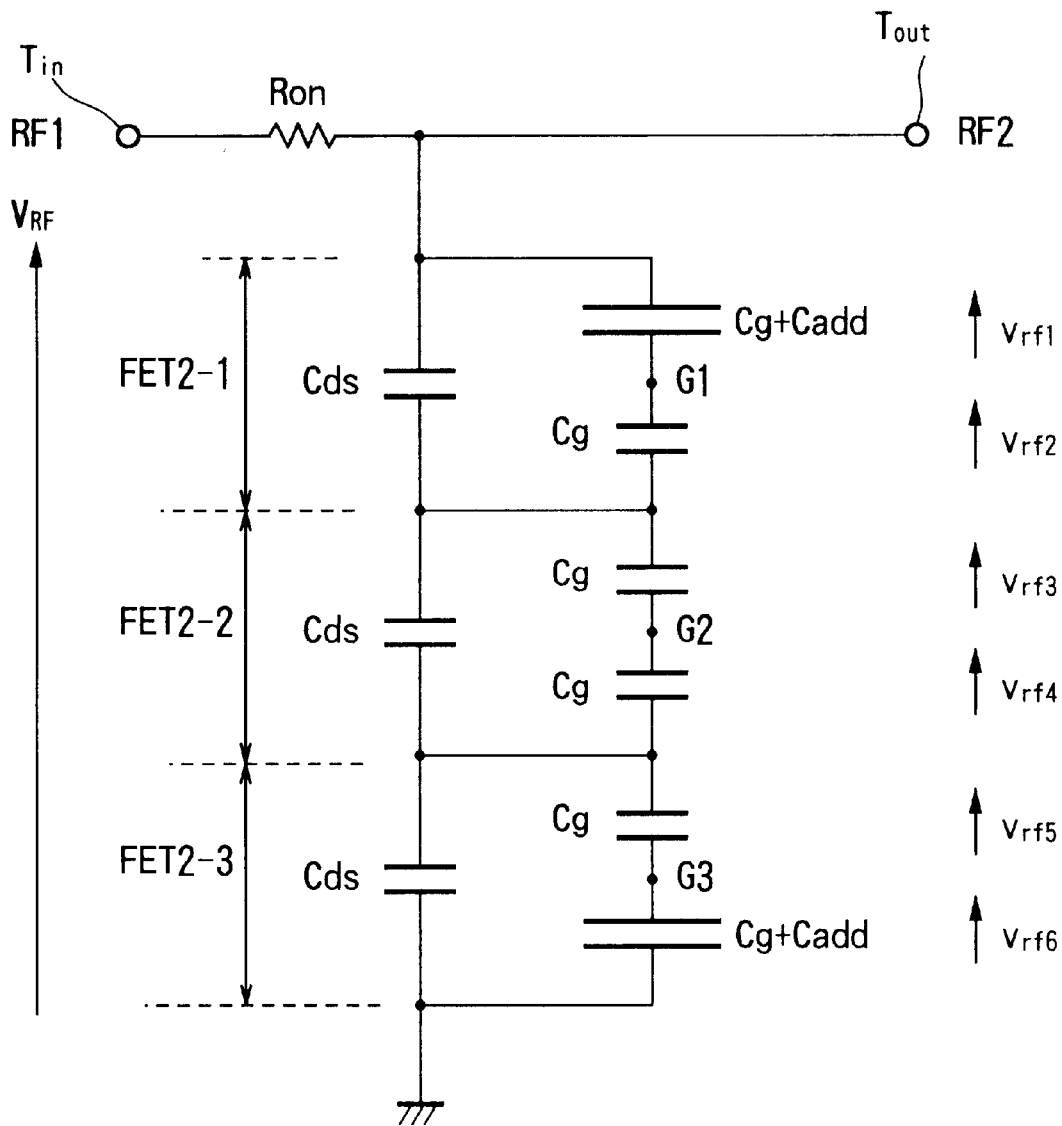
FIG. 6 is an equivalent circuit of the capacitance added type switching circuit in FIG. 5 in an on-state.

FIG. 5 is a circuit diagram of an example of a switching circuit aiming at the improvement of the power distortion tolerance by providing additional capacitance elements. FIG. 6 shows an equivalent circuit of the capacitance-added type switching circuit.

In the switching circuit shown in FIG. 5, additional capacitance elements Cadd are connected between a signal input terminal and gate of the switching FET 1-1 and between the signal output terminal and gate of the FET 1-3. Also, additional capacitance elements Cadd are connected between a terminal of the short-circuiting FET 2-1 connected to the output terminal Tout and its gate and between a terminal of the FET 2-3 connected to the common line Vss and its gate.

Figure 2:
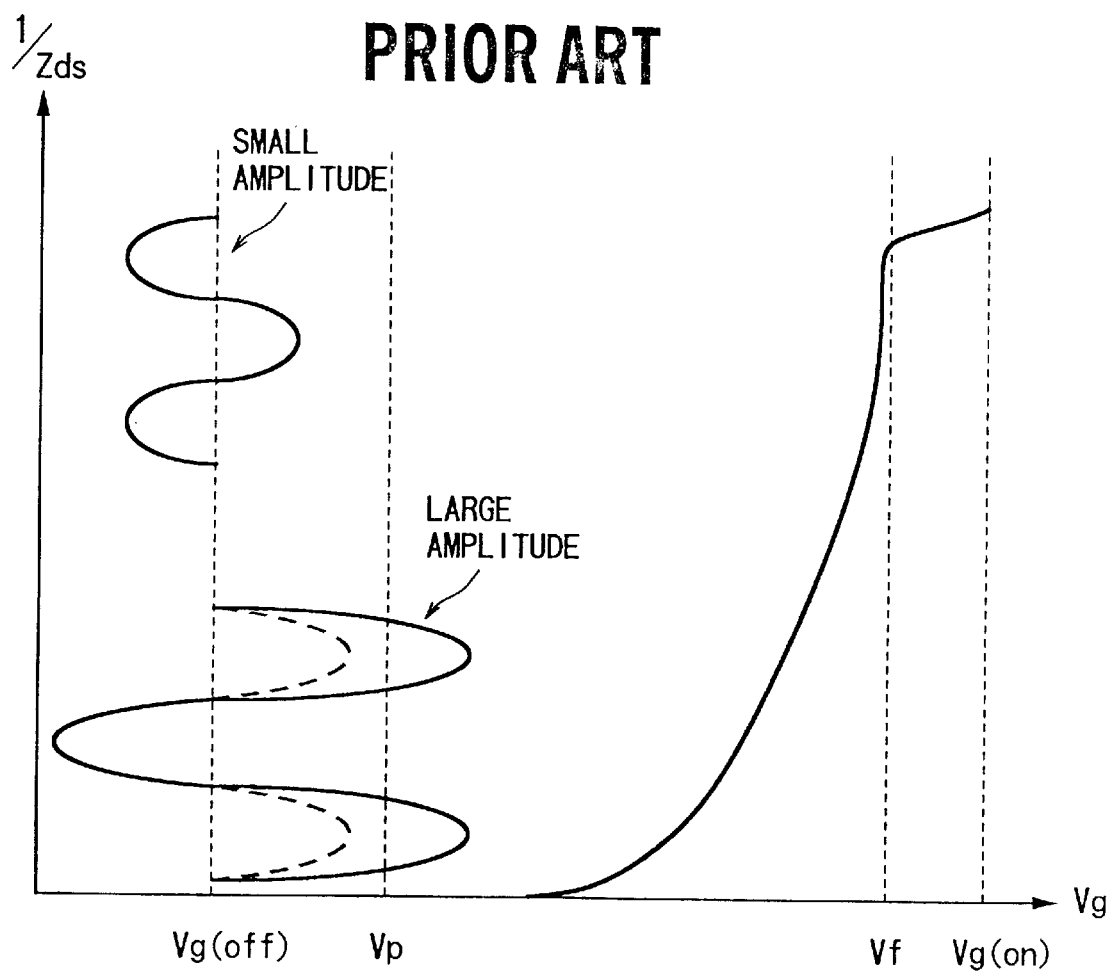
FIG. 2 is a view of a gate-bias condition of a switching FET used in the explanation of the disadvantage to be overcome in the prior art.
Figure 3:
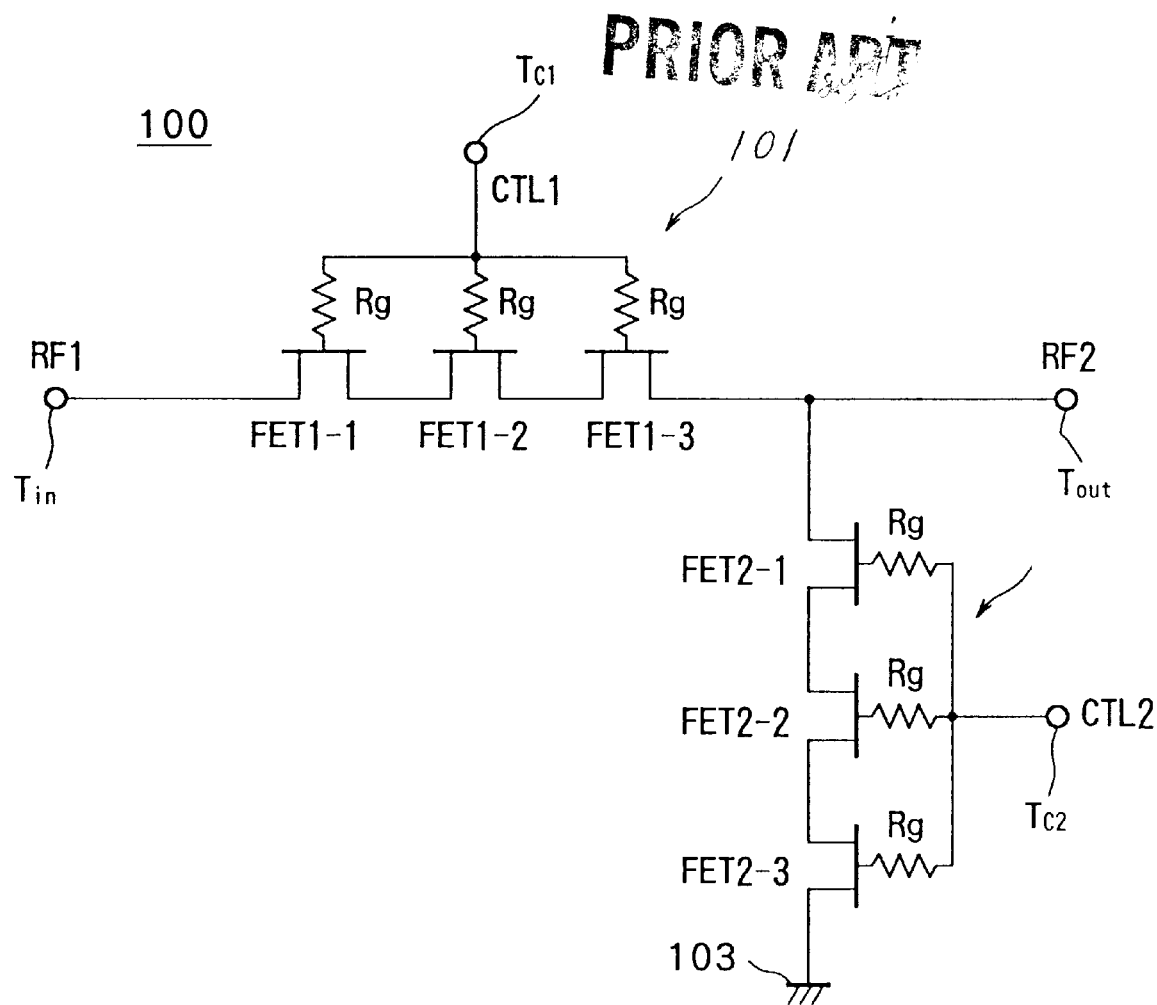
FIG. 3 is a circuit diagram of a example of an FET switching circuit having a three-stage configuration of the related art.
Figure 4:
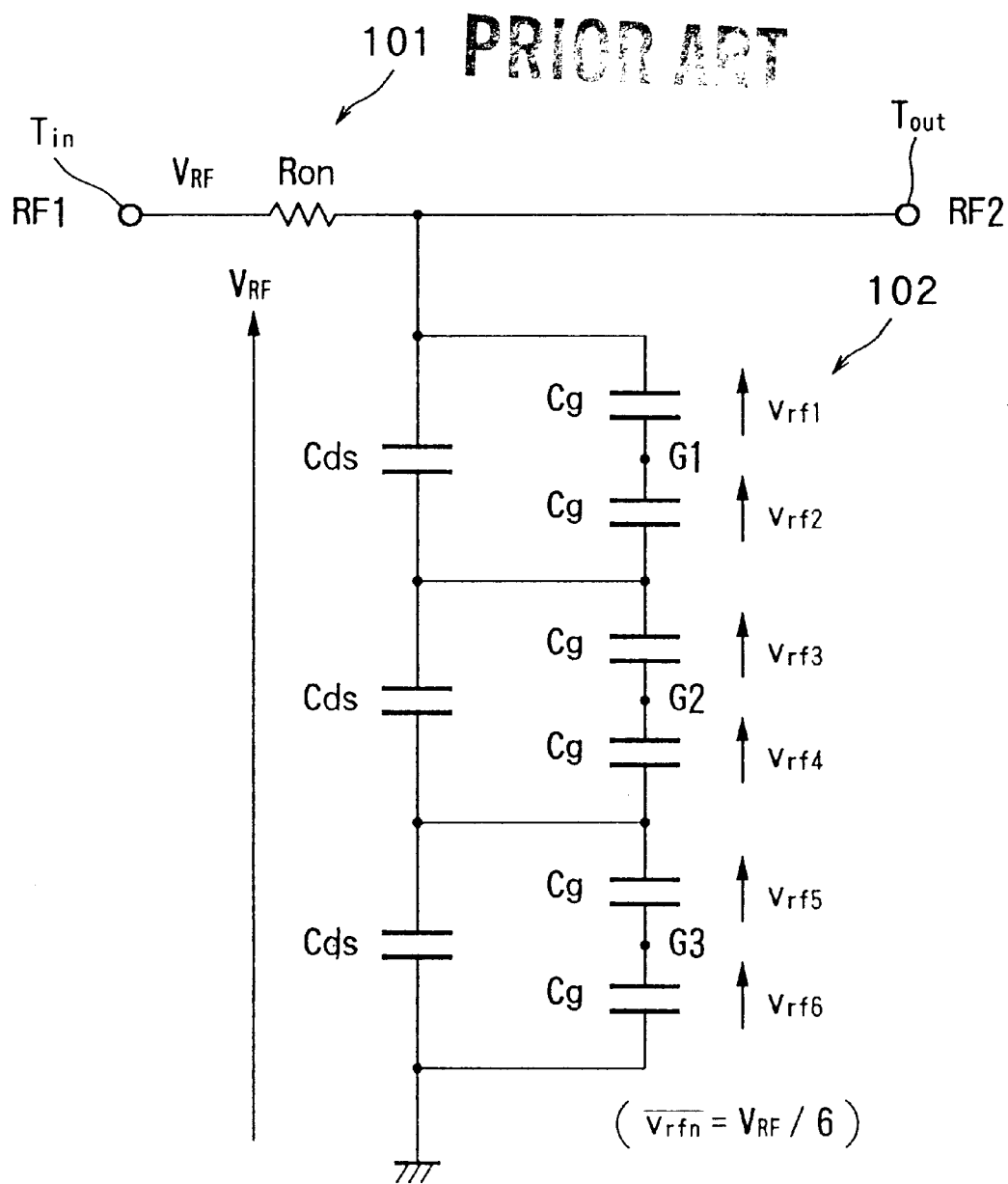
FIG. 4 is circuit diagram of the equivalent circuit when the high-frequency switching circuit shown in FIG. 3 is turned on, that is, when the switching FET portion is in an on-state and the cut-off FET portion is in an off-state.

Due to this, in the equivalent circuit of the switching circuit in the on-state (FIG. 6), the capacitance between the drain and the gate of the short-circuiting FET 2-1 and the capacitance between the source and the gate of the short-circuiting FET 2-3 are set to be larger values (Cg+Cadd) than the usual capacitance, the impedance of this portion becomes lower than capacitance between other gates, and the voltages vrf1 and vrf6 applied divided to this portion become lower than the voltages vrf2 to vrf5 applied to the capacitance Cg between other gates. The change of the applied voltage closes the channels of the FET 2-1 and FET 2-3 to which the capacitances are added, and, as shown in FIG. 2 with a dotted line, has the same effect as an apparent reduction in the amplitude of the modulated voltage. Accordingly, the power distortion tolerance is improved in the FET 2-1 and FET 2-3, an extra margin of the applied voltage is generated in the other FET 2-2, and the RF signal becomes resistant to distortion even if a large power is input to the switching circuit as a whole.

Since conventional FETs have limited gate areas, an FET having a so-called inter-digital gate structure is often used in the field of high-frequency circuits to widen the gate width. In such FETs, an effective gate portion is divided into a plurality of sections that are arranged in parallel.

Figure 7:
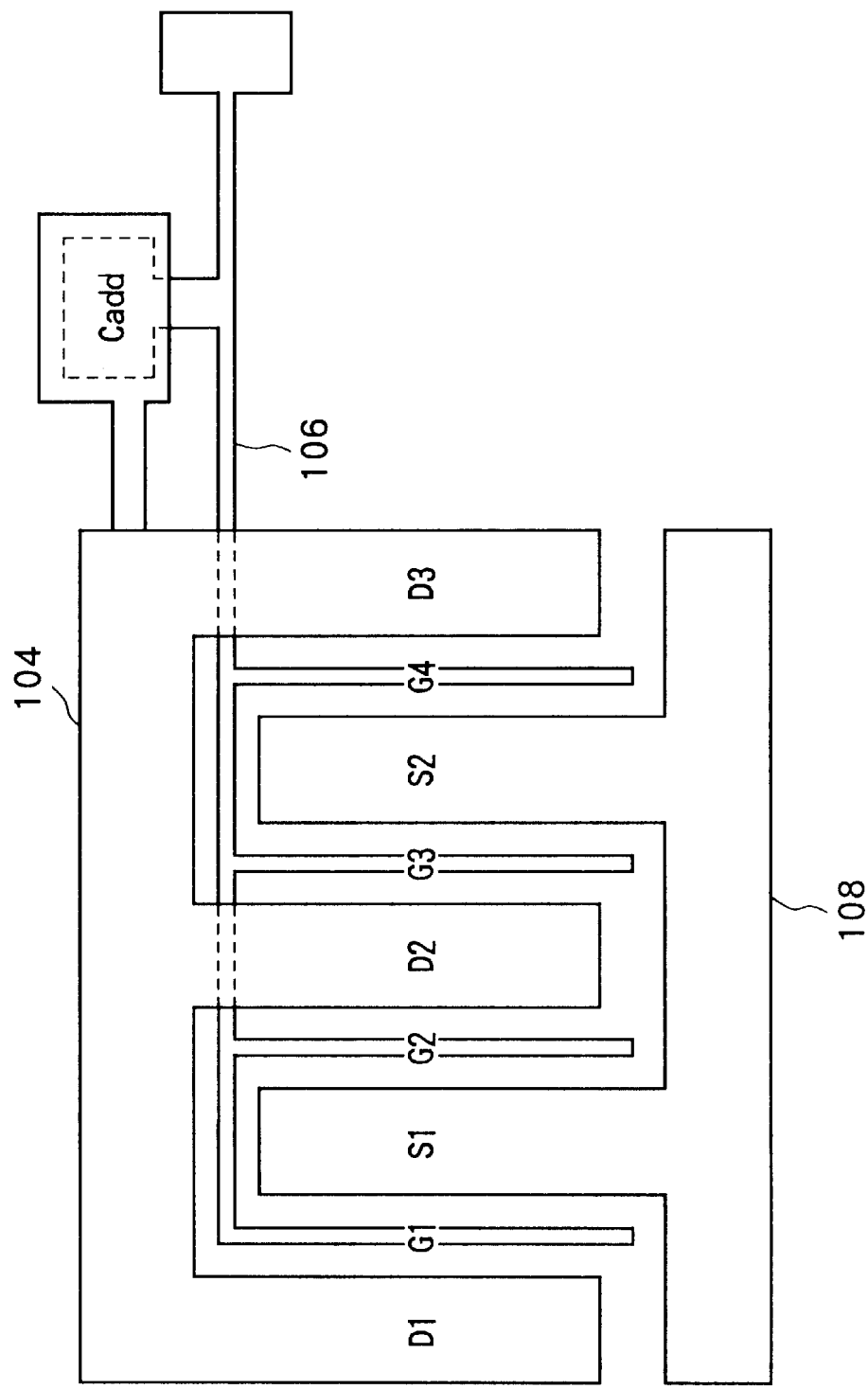
FIG. 7 is a plan view of a FET having a inter-digital gate structure as an example of a capacitance added type of FIG. 5.
Figure 8:
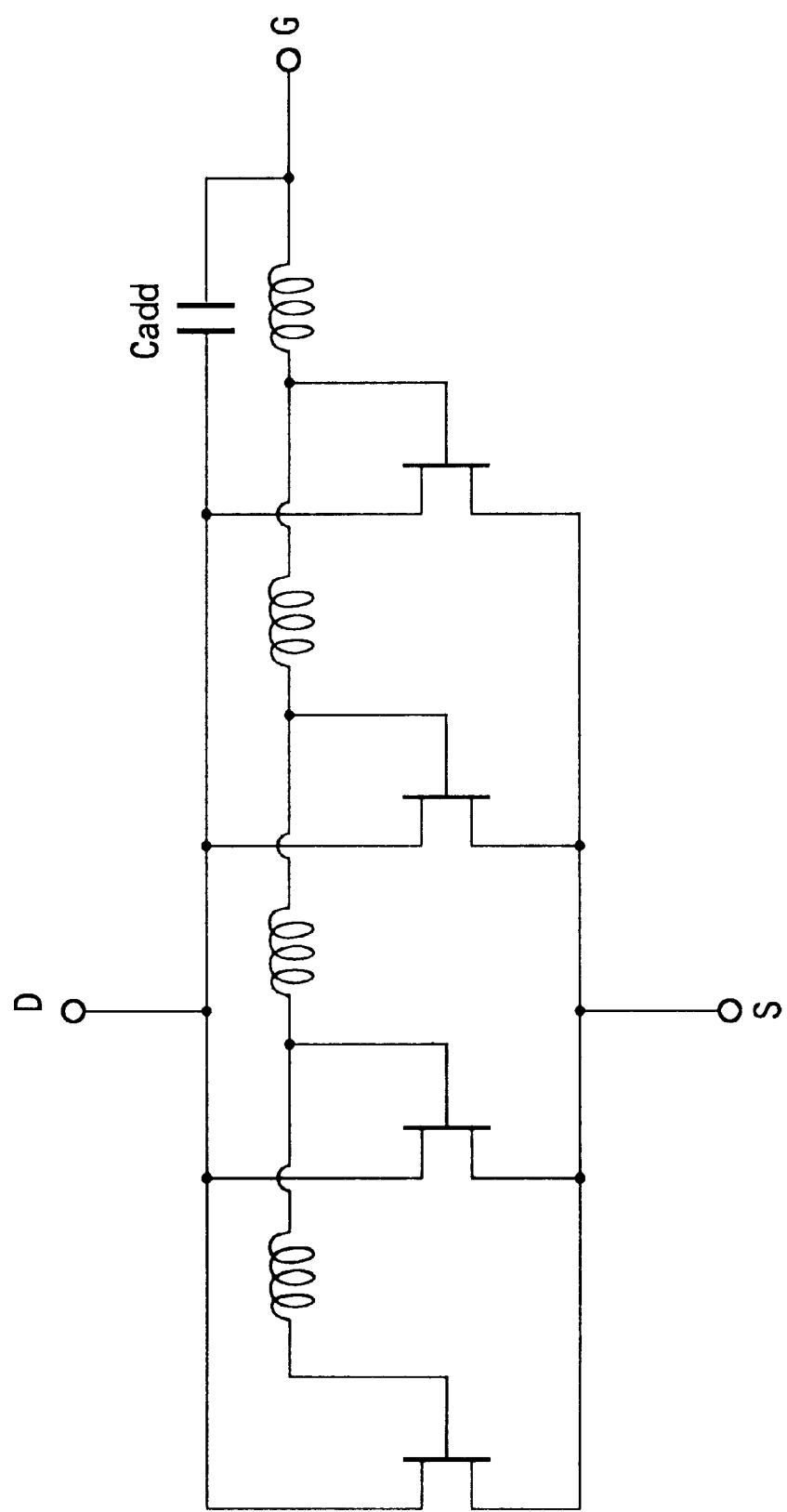
FIG. 8 is an equivalent circuit diagram of the FET shown in FIG. 7.

FIG. 7 is a plan view of an FET having an inter-digital gate structure to which a capacitance element is added. FIG. 8 is an equivalent circuit of the FET in FIG. 7.

When adding a capacitance element to an inter-digital FET, as shown in FIG. 7, the capacitance element Cadd is externally provided to the FET, for example, between the drain electrode 104 and the gate electrode 106. This is because if a capacitance element is provided externally, as opposed to an existing component of an inter-digital FET used as a standard cell and library in pattern design, there is no need to provide a new integral component and therefore later change of the capacitance is relatively easy. Such external addition of a capacitance element is normally done using the spare space around the FET in designing an ordinary monolithic microwave IC (MMIC).

However, in a switching FET which is provided with an external additional capacitance element in this way, the distances from the additional capacitance element Cadd to the unit gates G1, G2, G3, and G4 of effective gate sections are different. Also, the distances from the effective gate sections G1, G2, G3, and G4 to the additional capacitance elements Cadd themselves are long and the widths of the gate leads are narrow for the signal frequency, therefore a parasitic component, especially an inductance component, is added between the effective gate sections and the additional capacitance element Cadd.

Expressing this relationship between the unit gates and the additional capacitance element and the parasitic inductance on an equivalent circuit, the result is FIG. 8.

As is clear from this equivalent circuit, the relationship between the unit FETs and the added capacitance element Cadd is not constant. Moreover, there is the added difference of an inductance component due to the lead lines from the gates and therefore the impedance varies further widely when viewed from the unit FETs. As a result, there has been a disadvantage that the operation easily becomes unstable, the effects of improvement of the power distortion tolerance by adding a capacitance element is decreased, and therefore the distortion of an output signal cannot be reduced as expected.

Below, means to solve the disadvantage will be explained.

Figure 9A:
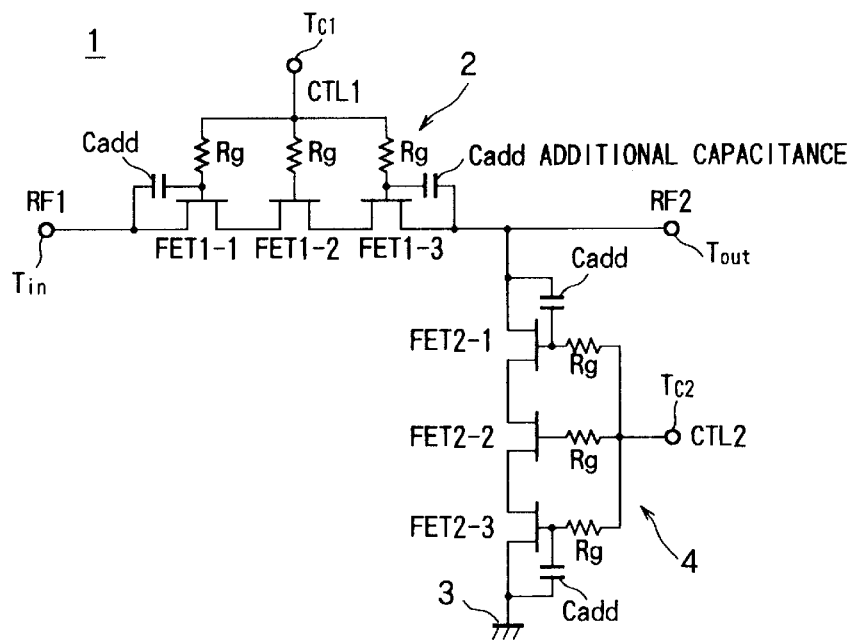
FIG. 9A is a circuit diagram of a high-frequency switching circuit according to the present embodiment.
Figure 9B:
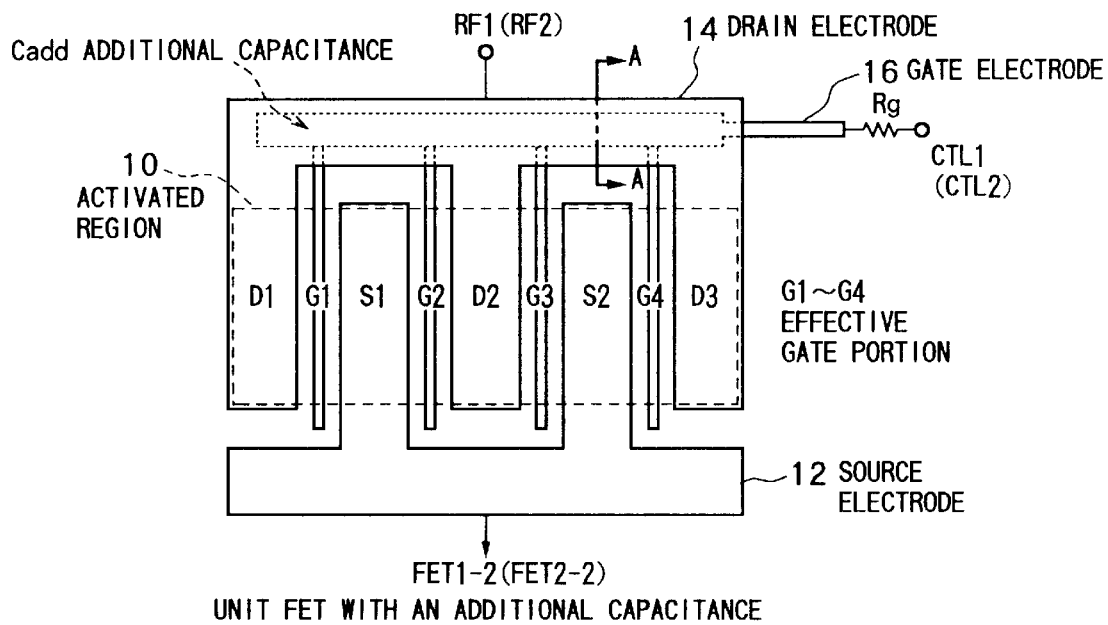
FIG. 9B is a plan view of a unit transistor (FET 1-1) with an additional capacitance element.
Figure 10:
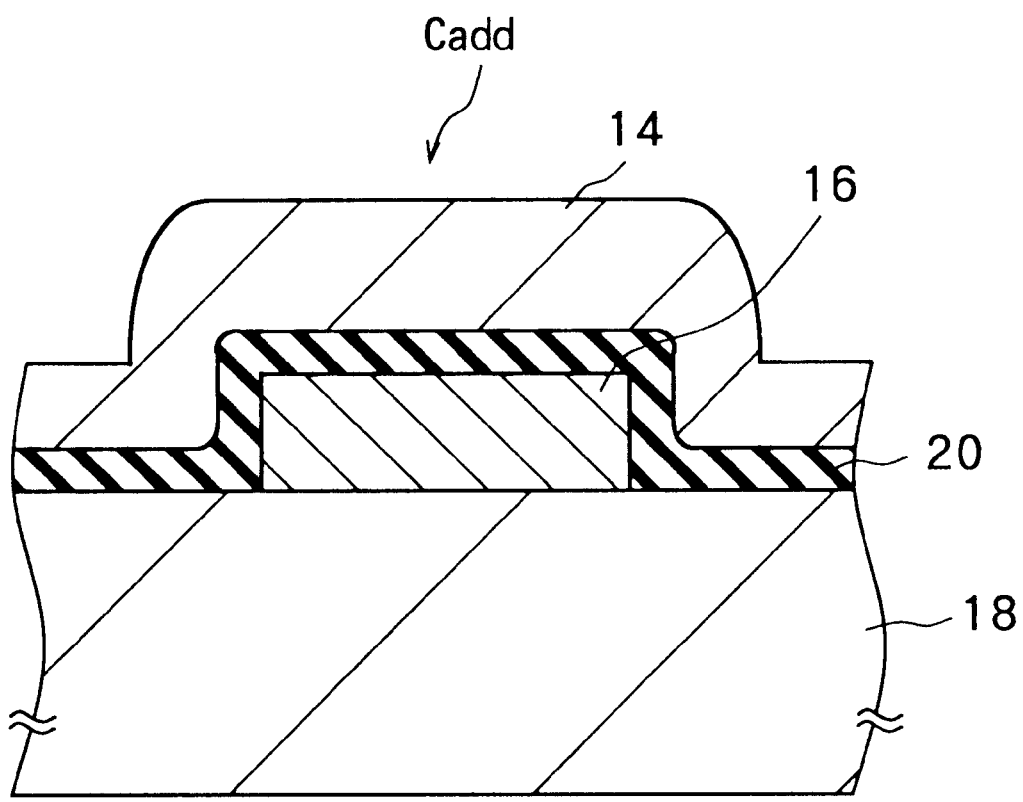
FIG. 10 is cross-sectional view along line A—A of FIG. 9B.
Figure 11:
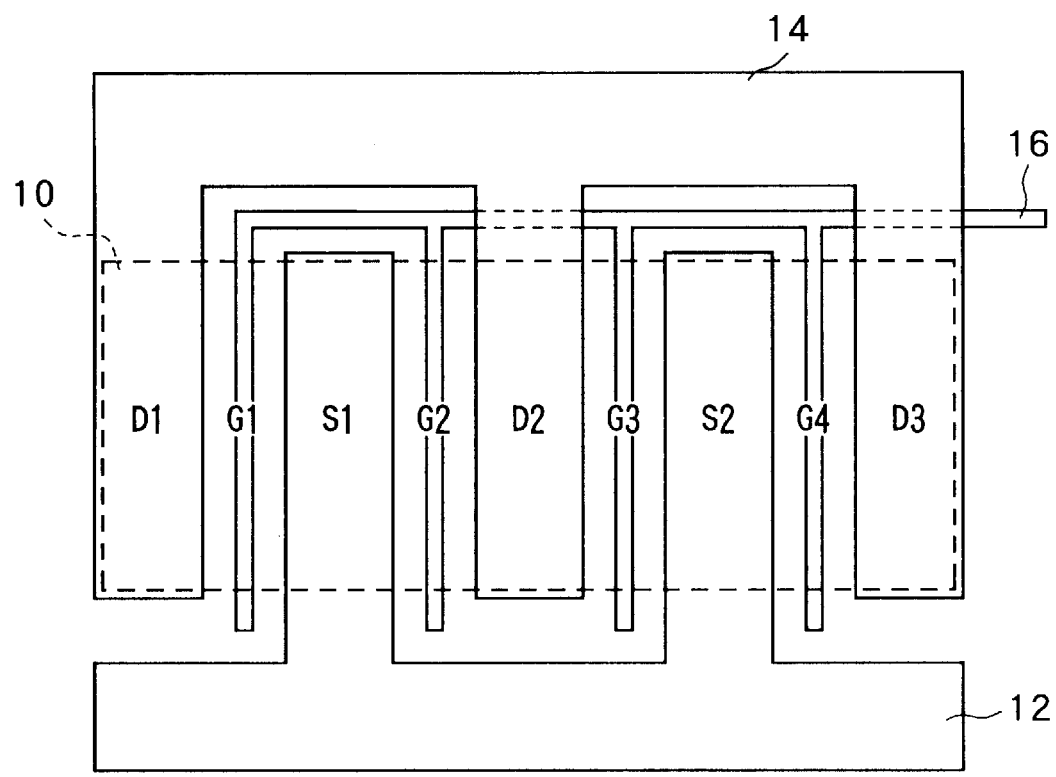
FIG. 11 is a plan view of a unit transistor (FET 1-2) without an additional capacitance element.
Figure 12:
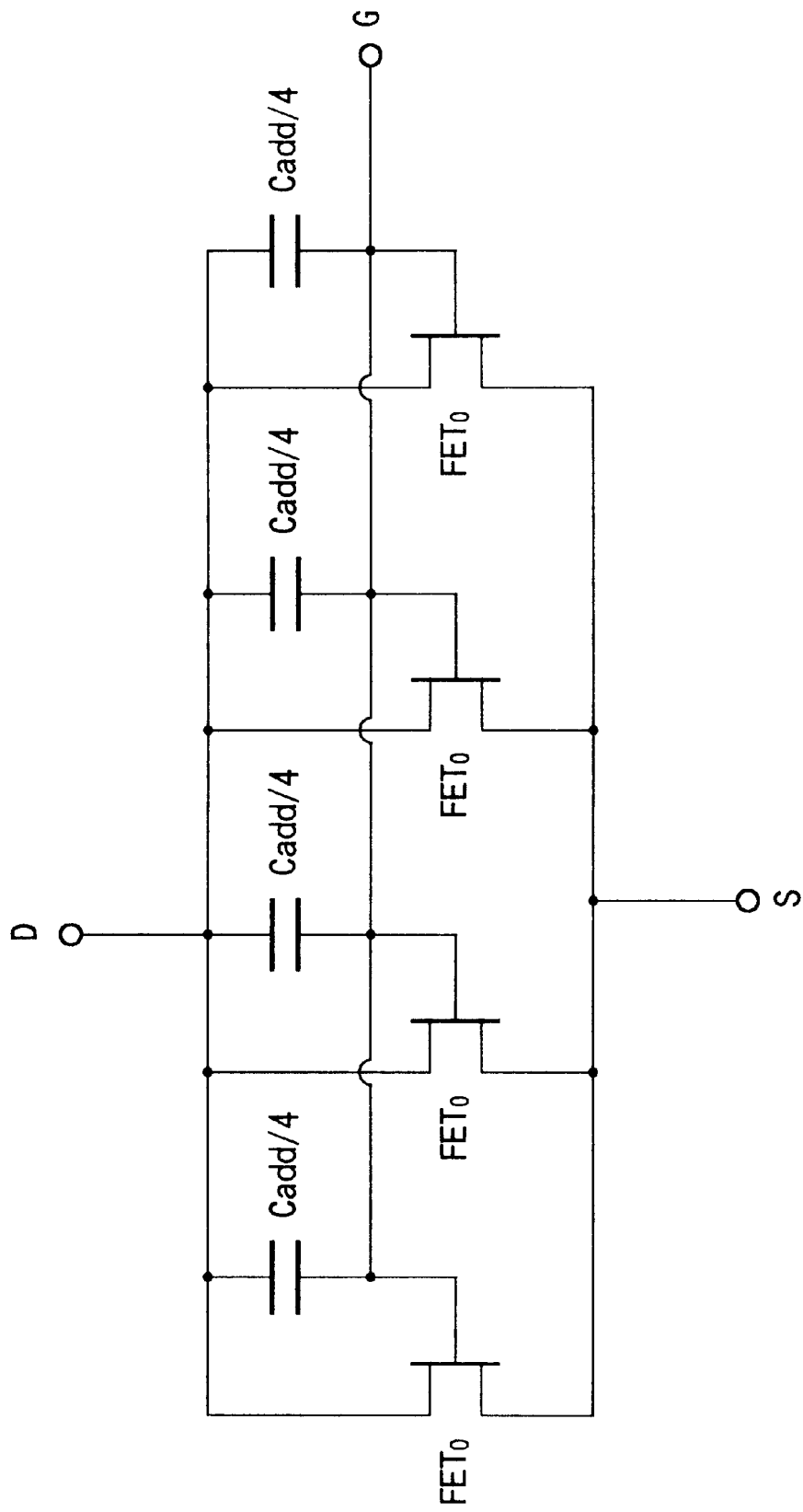
FIG. 12 is an equivalent circuit diagram of a unit transistor with an additional capacitance element.

FIG. 9A is a circuit diagram of a high-frequency switching circuit of the second embodiment according to the present invention. FIG. 9B is a plane view of a unit transistor (FET 1-1) having an additional capacitance element. FIG. 10 is a cross-sectional view taken along the line A—A in FIG. 9B, FIG. 11 is a plane view of a unit transistor (FET 2-2) without an additional capacitance element, and FIG. 12 is an equivalent circuit diagram of a unit transistor with an additional capacitance element.

The high-frequency switching circuit 1 shown in FIG. 9A comprises a switching FET portion 2 provided between the input terminal Tin and the output terminal Tout of an RF signal and a short-circuiting FET portion 4 connected between the output (output terminal Tout) of the switching FET portion 2 and a supply line (Vss line 3) of a common voltage and connects the output node of the switching FET portion 2 to the common voltage Vss when turned off. Each portion has a multi-stage configuration such as a 3-stage FET configuration.

Specifically, in the switching FET portion 2, the three FET 1-1 to FET 1-3 are connected in series between the input terminal Tin and the output terminal Tout of the RF signal, and gates of the FET are connected to a common control signal input terminal Tc1 via high resistance elements Rg. Similarly, in the short-circuiting FET portion 102, the three FET 2-1 to FET 2-3 are connected in series between the output terminal Tout and a Vss line 3, and gates of the FETs are connected to a common control signal input terminal Tc2 via the high resistance elements Rg.

In these lines of unit transistors, that is, the line of unit transistors formed by the series connection of the FET 1-1 to FET 1-3 and the line of the unit transistors formed by the series connection of the FET 2-1 to FET 2-3, the additional capacitance elements Cadd are connected to the unit transistors positioned at the two end portions. Specifically, additional capacitor elements Cadd are connected between gate electrodes of the FET 1-1, FET 1-3, FET 2-1, and FET 2-3 and an external source or a drain electrode. These FETs are called "unit FETs with additional capacitance elements".

The other FETs, that is, the FET 1-2 and FET 2-2, do not have additional capacitance elements Cadd connected to them and are called "unit FETs without additional capacitance elements".

A unit FET with an additional capacitance element has a so-called inter-digital gate structure as represented by the FET 1-1 shown in FIG. 9B. Namely, the semi-insulative GaAs substrate is provided on the surface region with an activated region 10 which is made conductive by introducing impurities by for example ion implantation. The gate electrode portion (effective gate portion) extending in the activated region 10 is divided into a plurality of sections. In the unit FET of the illustrated example, four elongated effective gate sections G1 to G4 are arranged in parallel at equal intervals. In the spaces between the effective gate sections G1 to G4 and in the external regions, drain electrode portions D1, D2, and D3 and source electrode portions S1 and S2 are alternately arranged a distance from the effective gate sections. Namely, the drain electrode portions, the source electrode portions, and the effective gate sections are arranged in the order of D1, G1, S1, G2, D2, G3, S2, G4, and D3.

The source electrode portions S1 and S2 are connected in common at one outer side of the activated regions 10, whereby the source electrode 12 is comprised. This source electrode 12 in the FET 1-1 is connected to the FET 1-2 in FIG. 9A.

The drain electrode portions D1 to D3 are connected in common at another outer side of the activated region 10, whereby the drain electrode 14 is comprised. The drain electrode 14 in this FET 1-1 is connected to the input terminal Tin in FIG. 9A.

The effective gate sections G1 to G4 are connected in common under the connection portion of the drain electrode portions D1 to D3 and is led to the outside the FET, whereby the gate electrode 16 is comprised.

Note that illustration of an ohmic electrode is omitted in FIG. 9B.

In the FETs at the two ends of the FET portions represented by this FET 1-1, the connection portion of the drain electrode 14 and the connection portion of the gate electrode 16 are arranged overlapping each other. Additional capacitance elements Cadd are formed at these portions. When looking at this portion in the cross-sectional view of FIG. 10 as an example, the gate electrode 16, inter-layer insulating film 20, and drain electrode 14 are superposed in that order on the GaAs substrate 18, whereby an additional capacitance element Cadd is formed using the gate electrode 16 as a lower electrode, the inter-layer insulating film 20 as a capacitor insulating film, and the drain electrode 14 on top of the gate electrode 16 as an upper electrode. The capacitance of the additional capacitance element Cadd is decided by the width of the connection portion of the gate electrode 16 in addition to the thickness of the inter-layer insulating film and the dielectric constant, therefore the connection portion is formed a little wider than the lead out portion of the gate electrode 16.

The additional capacitance element Cadd arranged in this way is, as shown in FIG. 12, equivalent to four FETO using the effective gate sections G1 to G4 as gate electrodes connected in parallel with capacitance elements of about Cadd/4 inserted between their gates and drain terminals. Note that, in actuality, these capacitance elements are formed integrally by sandwiching the insulating film between the drain and gate electrodes as explained above and that positive use is made of the capacitance between the drains and gates which would become parasitic capacitances in the first embodiment. Therefore, this additional capacitance element Cadd can be viewed as substantially a lumped constant in the quasi-microwave band.

In the first embodiment, as shown in FIG. 7 and FIG. 8, the connection portion and the lead out portion of the gate electrode are made elongated in order to reduce the parasitic capacitance component as much as possible. Accordingly, parasitic inductance components were added in an unbalanced way. In contrast to this, this example is configured with the gate directly led out from the lower electrode of the capacitor, and the line width for securing the capacitance value is relatively wide, therefore almost no parasitic inductance and other parasitic components are generated.

On the other hand, in a unit FET without an additional capacitance element, as shown in FIG. 11, to reduce the parasitic capacitance as much as possible, the connection portion of the gate electrode 16 does not overlap the connection portion of the drain electrode 14. The connection portion of the gate electrode 16 can be arranged to be outside of the drain electrode 14, however it is arranged inside the drain electrode 14 in the example in FIG. 11. Due to this, a unit FET without an additional capacitance element has certain amount of parasitic capacitance, but does not have a large additional capacitance element Cadd as shown in FIG. 9B.

Next, the operation of a high-frequency switching circuit 1 having the above configuration will be explained. Note that the basic operation of the high-frequency switching circuit 1 of this example is exactly the same as that of the first embodiment. Accordingly, the equivalent circuit shown in FIG. 6 can be also applied as it is to this example.

As shown in FIG. 6, when the high-frequency switching circuit 1 is on, all of the switching FET 1-1 to FET 1-3 are on and all of the short-circuiting FET 2-1 to FET 2-3 are off. When the high-frequency switching circuit 1 is cut off, all of the switching FET 1-1 to FET 1-3 are turned off while all of the short-circuiting FET 2-1 to FET 2-3 are on. Even if there is slight signal leakage when switching FET 1-1 to FET 1-3 to an off-state, the signal leakage is grounded to the common potential Vss. Thus, a high reliability at high frequencies between the input and the output can be attained.

By connecting the FET portions in multi-stages, the voltage of the RF signal input is divided in accordance with the number of the stages. As a result, the maximum power handled by the switching circuit increases and the distortion tolerance at the time of a large power input is improved. This is the same as in the related art.

Further, the fact that the addition of a capacitance element improves the power distortion tolerance is also the same as in the related art. Namely, in the equivalent circuit (FIG. 6) of the switching circuit 1 in an on-state, the capacitance element between the drain and the gate of the short-circuiting FET 2-1 and the capacitance element between the source and the gate of the short-circuiting FET 2-3 are respectively set to be larger (Cg+Cadd) than a usual capacitance value. As a result, the impedance at this portion becomes lower than the capacitance Cg between other gates, and the voltages vrf1 and vrf6 applied divided to this portion become lower than the voltages vrf2 to vrf5 applied to the capacitance Cg between other gates. The change of this applied voltage closes channels of the FET 2-1 and FET 2-3 to which the capacitance elements Cadd are added and results in similar effects to the apparent decrease of the amplitude of the modulated voltage at this portion. Accordingly, the power distortion tolerance in the FET 2-1 and the FET 2-3 is improved, a greater margin for applied voltage is generated in the other FET 2-2, and the RF signal becomes resistant to distortion even if a large power is input to the switching circuit as a whole.

While the equivalent circuit will not be shown here, in the same way, when the switching circuit 1 is in an off-state, that is, the switching FET portion 2 is in an off-state, providing additional capacitance elements Cadd to the FET 1-1 and FET 1-3 near the input and output terminal sides makes the RF signal resistant to distortion. Consequently the effects is combined to the distortion reducing effect at the time of the above switched on-state, and the power distortion tolerance in the high-frequency switching circuit 1 is improved.

In particular, in the high-frequency switching circuit 1 of this example, since the unit transistors comprising the switching FET portion 2 and the cut-off FET portion 4 have inter-digital gate structures and the additional capacitance elements Cadd are arranged at positions in proximity to the connection portions of the plurality of effective gate sections G1 to G4, the impedance seen from the effective gate sections G1 to G4, that is, the value of the additional capacitance element Cadd, and the inductance of the connecting line etc. can be balanced and the parasitic components themselves are small. Due to this, the operation of the FET 1-1, FET 1-3, FET 2-1, and FET 2-3 with the additional capacitance elements become stables and the operation of the whole switching circuit becomes stable as well.

Due to this operational stability, extremely excellent characteristics as a large power switching circuit driven by a low voltage can be obtained without a loss of improvement of the power distortion tolerance obtained by the above multi-stage configuration and the addition of the capacitance elements. Also, this improvement of the power distortion tolerance means a possibility of driving by a further lower voltage while maintaining the strength (large power) of a high-frequency signal handled.

Furthermore, since the additional capacitance element Cadd is formed by using the gate electrode 16 and the drain electrode 14 inside the arrangement region, there is no increase of the area when adding a capacitance element and a low cost can be realized.

Figure 13:
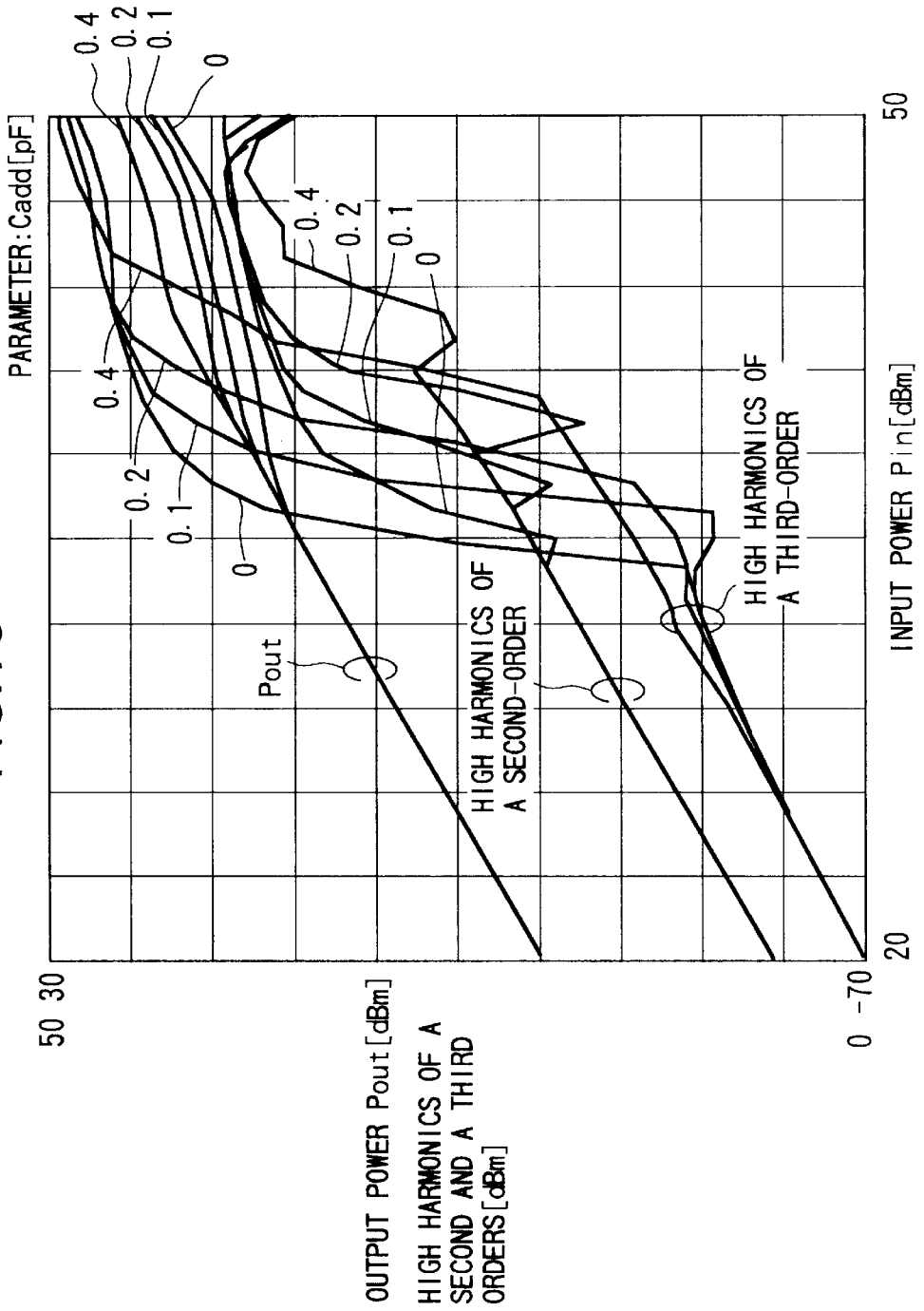
FIG. 13 is a view of the results of simulation of the characteristics of the second-order and third-order harmonics and output power to the input power in the high-frequency switching circuit 1 of the example shown in FIG. 9.

FIG. 13 is a view of results of simulation of the characteristics of the second-order and third-order harmonics and the output power to the input power in the high-frequency switching circuit 1 of the example shown in FIG. 9.

As clear from FIG. 13, the input power where an increase of the harmonics (second-order and third-order harmonics) and a decrease of output power with respect to the input power (power loss) start to appear increases along with an increase of the additional capacitance Cadd. In other words, within the range of the additional capacitance value (up to 0.4 pF) used in this simulation, it became clear that the larger the additional capacitance, the better the power distortion tolerance.

Note that the FET portions 2 and 4 were made to three-stage configurations in the above explanation, however, the number of stages n is not limited. Generally, when supposing that the maximum power handled Pmax of a high-frequency switching circuit having as basic blocks n-stage series connected FETs is determined by the power tolerances of the FETs at the two ends of the blocks, it can be represented by the following formula:

$$P\max=2[\{(nCg+(n-1)C\text{add})/Cg\}\{Vp-Vg(\text{off})\}]^2/Zo \quad (2)$$

It can be said from the formula that when the on-resistances Ron of the FET portions 2 and 4 serving as the basic blocks are sufficiently low and until reaching the limits of the power tolerance of the FETs at the two ends of the FET portions 2 and 4, an increase of the number of stages n in the FET portions improves the maximum power handled Pmax and therefore is desirable.

In the above explanation, the case where additional capacitance elements Cadd were added to the FET 1-1 and FET 1-3 and the FET 2-1 and FET 2-3 at the two ends of the FET portions 2 and 4 was explained.

However, signal distortion can also occur at the intermediate FETs (FET 2-2 in FIG. 6) when an RF signal having a large amplitude is input, so providing of additional capacitance elements Cadd to these portions contributes to the improvement of the overall power distortion tolerance. Accordingly, the positions and the number of unit FETs where the additional capacitance elements Cadd are provided are not limited in the present invention. Of course, additional capacitance elements Cadd can be provided between the sources and the gates of the unit FETs rather than at the drain side as shown in the figure. Also, as the FET, an MESFET, a HEMT, or an insulation gate type can be used instead of the junction type transistor (JFET).

According to the high-frequency circuit of the present invention, in the unit transistors with additional capacitance elements comprising the lines of transistors forming the basic blocks of the high-frequency switching circuit, the switching operation can be stabilized by arranging the additional capacitance elements in a balanced way. As a result, the effects in the related art which were canceled out by the unstable operation of the unit transistors to which the additional capacitance elements were added in an unbalanced way, that is, the effects by adoption of a multi-stage configuration and the provision of additional capacitance elements themselves, are brought out sufficiently in the present invention and excellent power distortion tolerance close to the ideal can be realized. The improvement of the power distortion tolerance increases the leeway for further voltage reduction.

Further, there is no increase in chip area accompanying the addition of capacitance elements at all and there is no accompanying increase in the manufacturing steps, therefore there is no increase in cost.

As explained above, according to the present invention, it is possible to realize a high-frequency circuit capable of handling a large power with a low driving voltage and a low cost.

Note that the present invention is not limited to the above embodiments and includes modifications within the scope of the claims.

What is claimed is:

1. A high-frequency circuit, comprising:
   a switching transistor including a source with a source electrode formed on a source region, a drain with a drain electrode formed on a drain region, and a gate with a gate electrode connected to an effective gate portion divided into a plurality of sections, said switching transistor being configured such that:
   (1) one of said source electrode and said drain electrode is connected to an input terminal,
   (2) the other of said source electrode and said drain electrode is connected to an output terminal, and
   (3) said effective gate portion is connected through a resistance element to a control terminal; and
   a first additional capacitance element located proximate ends of at least two of the plurality of gate sections and electrically connected between said gate electrode and either of said source electrode or said drain electrode,
   wherein said first additional capacitance element is formed by physically overlapping said gate electrode and either of said source electrode or said drain electrode.

2. A high-frequency circuit according to claim 1, further comprising:
   a short-circuiting transistor including a source, a drain, and a gate, said short-circuiting transistor being connected between said output terminal and a reference voltage supply line and being held in a non-conductive state when said switching transistor is in a conductive state and which shifts to a conductive state when said switching transistor is in a non-conductive state.

3. A high-frequency circuit according to claim 2, wherein:
   said short-circuiting transistor includes a gate having an effective gate portion divided into a plurality of sections, and
   said circuit further comprises a second additional capacitance element located proximate ends of at least two of the plurality of said short-circuiting transistor gate sections, said second additional capacitance element being connected in parallel to a capacitance element between said gate and a source or a drain of said short-circuiting transistor.

4. A high-frequency circuit according to claim 1, wherein said switching transistor comprises a plurality of series-connected switching unit transistors having commonly connected gates, and
   wherein at least one of the plurality of series-connected switching unit transistors includes said first additional capacitance element.

5. A high-frequency circuit according to claim 2, wherein said short-circuiting transistor circuit comprises a plurality of series-connected short-circuiting unit transistors having commonly connected gates.

6. A high-frequency circuit according to claim 4, further comprising:
   a plurality of first additional capacitance elements,
   wherein said first additional capacitance elements are connected between said gates, and either said sources or said drains of switching unit transistors positioned at two ends of a line of said series-connected unit transistors.

7. A high-frequency circuit according to claim 5, wherein at least one of said plurality of short-circuiting unit transistors includes a second an additional capacitance element.

8. A high-frequency circuit according to claim 7, further comprising:

a plurality of second additional capacitance elements, wherein said second additional capacitance elements are connected between said gates, and said sources or said drains of short-circuiting unit transistors positioned at two ends of a line of said series-connected unit transistors.

9. A high-frequency circuit according to claim 1, wherein said first additional capacitance element is formed by interposing an insulating film between said gate and either of said source or said drain.

10. A high-frequency circuit according to claim 3, wherein said second additional capacitance element is formed by interposing an insulating film between two metal layers.

11. A high-frequency circuit according to claim 2, wherein said switching transistor and said short-circuiting transistor are formed on a single semiconductor substrate.

12. A high-frequency circuit according to claim 11, wherein said semiconductor substrate comprises gallium arsenide.

13. A high-frequency circuit according to claim 1, wherein said switching transistor is a junction-type field effect transistor.

14. A high-frequency circuit according to claim 2, wherein said short-circuiting transistor is a junction-type field effect transistor.

15. A high-frequency circuit according to claim 1, wherein said gate electrode is conductive.

16. A high-frequency circuit according to claim 1, wherein said first additional capacitance element provides a means for reducing signal distortion.

17. A high-frequency circuit according to claim 1, wherein said gate electrode is wider than said effective gate portion.

* * * * *

UNITED STATES PATENT AND TRADEMARK OFFICE
CERTIFICATE OF CORRECTION

PATENT NO. : 6,563,366 B1
DATED : September 3, 2002
INVENTOR(S) : Kazumasa Kohama et al.

It is certified that error appears in the above-identified patent and that said Letters Patent is hereby corrected as shown below:

<u>Title page,</u>
Item [57], ABSTRACT,
Line 9, replace "ends" with -- end --.

<u>Column 12,</u>
Line 68, remove "an"

Signed and Sealed this

Ninth Day of September, 2003

JAMES E. ROGAN
*Director of the United States Patent and Trademark Office*